United States Patent
Miyamoto

(10) Patent No.: US 6,284,649 B1
(45) Date of Patent: Sep. 4, 2001

(54) CHEMICAL VAPOR PHASE GROWING METHOD OF A METAL NITRIDE FILM AND A METHOD OF MANUFACTURING AN ELECTRONIC DEVICE USING THE SAME

(75) Inventor: Takaaki Miyamoto, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/233,912

(22) Filed: Jan. 21, 1999

(30) Foreign Application Priority Data

Jan. 30, 1998 (JP) .................................................. 10-019525

(51) Int. Cl.⁷ .............................................. H01L 21/4763
(52) U.S. Cl. ........................... 438/643; 438/680; 438/685
(58) Field of Search .................................. 438/597, 677, 438/680, 685, 688, 643, 653; 427/566, 530, 531

(56) References Cited

U.S. PATENT DOCUMENTS 5,567,243 * 10/1996 Foster et al. ......................... 118/730
5,834,371 * 11/1998 Ameen et al. ........................ 438/656
5,956,616 * 9/1999 Mizuno ................................. 438/680
5,989,652 * 11/1999 Ameen et al. ........................ 427/534

* cited by examiner

Primary Examiner—Caridad Everhart
(74) Attorney, Agent, or Firm—Ronald P. Kananen; Rader, Fishman & Grauer

(57) ABSTRACT

A method of chemical vapor growing a metal nitride film comprises steps of reducing to remove a native oxidation film on a substrate to be processed by activated hydrogen species, forming a metal film such as of W or Ta by plasma CVD, and then nitriding the metal film by activated NH species as a nitriding agent to convert the metal film into a metal nitride film such as of $W_2N$ or TaN. Formation and nitridation of the metal film may be repeated for several times. Since the metal compound gas and the nitriding gas are not simultaneously introduced into the CVD chamber, formation of dust of side reaction products such as ammonium halides can be decreased to reduce contamination in the chamber and on the substrate during film deposition, and since nitridation with the activated NH species is a readily proceeding reaction system, a sufficiently nitrided metal nitride film can be provided. The method is applicable to a method of manufacturing electronic devices.

22 Claims, 4 Drawing Sheets

CHEMICAL VAPOR PHASE GROWING METHOD OF A METAL NITRIDE FILM AND A METHOD OF MANUFACTURING AN ELECTRONIC DEVICE USING THE SAME

BACKGROUND OF THE INVENTION

1. Field of the Invention

The present invention relates to a method of chemical vapor growing of a metal nitride film and a method of manufacturing an electronic device using the same and, more specifically, it relates to a method of chemical vapor growing of a metal nitride film which is nitrided thoroughly to contain less impurities and with less dust of side reaction products formed during film deposition, as well as a method of manufacturing an electronic device having an interconnecting layer using the same.

2. Description of the Related Art

Al series metals such as Al—Si have been generally used as internal interconnecting material for semiconductor devices such as ULSI (Ultra Large Scale Integrated Circuits) and various kinds of electronic devices. In recent years, as the design rule for the interconnections has required a finer level in the order of less than sub-quarter micron, and integration degree and performance have been increased, there are various problems such as lowering of working frequency due to increase in the resistance of interconnections, increase of electric power consumption and deterioration of resistance to various migration.

Accordingly, use of Cu series metal interconnections with less specific resistivity compared with Al series metals has been considered. The specific resistivity of Cu is $1.72\ \mu\Omega\cdot cm$ which is about less than ⅔ of $2.7\ \mu\Omega\cdot cm$ of Al. Further, the Cu metal interconnections have higher resistance to electro migration or stress migration than Al series metal interconnections.

As the method of depositing a Cu film, a well-known electric field plating method is generally employed, but the method requires to form a seed layer previously as an underlying conductive layer for the Cu film and involves a problem in view of the matching property with other dry processes.

In view of the above, it has been attempted a method of depositing a Cu film by a sputtering method or a CVD (Chemical Vapor Deposition) method.

It has been known that Cu metal interconnections are excellent in electric performance and migration resistance but the Cu metal atom itself easily diffuses into Si or $SiO_2$. Therefore, in a semiconductor device, for instance, a barrier layer for inhibiting diffusion of the Cu atom has usually been formed prior to the formation of the Cu film on the underlying impurity diffusion layer, the lower interconnecting layer or interlayer insulation film.

Heretofore, TiN films have been used generally as a barrier layer for interconnections comprising high melting metals such as W and Al series metals. However, since a crystal structure grows in a columnar structure in the TiN film, it still leaves a possibility of diffusion of metal atoms along the grain boundary and the function as the barrier layer is not satisfactory for Cu atoms which diffuse more easily than Al atoms or W atoms.

Then, as a material for the barrier layer effective to the Cu metal film, TaN, $W_2N$, Ti—Si—N, W—Si—N, Ta—Si—N and the like have been noted. Since the materials described above have an amorphous structure, grain boundary diffusion is less likely to occur compared with a TiN film.

In actual semiconductor devices, since it is applied as a barrier layer in a connection hole (contact hole and via hole) at a high aspect ratio in a multi-layered interconnection structure, deposition of a TaN film, $W_2N$ film, Ti—Si—N film, W—Si—N film, Ta—Si—N film or the like by the CVD method, which is excellent in step coverage over the sputtering method, has been attempted.

As starting gases used in CVD for the metal nitride films, those exemplified in Table 1 are typically used.

TABLE 1

| Metal Nitride | Starting gas |
| --- | --- |
| TaN | $TaBr_5 + NH_3$ |
| $W_2N$ | $WF_6 + NH_3$ |
| Ti-Si-N | $TiCl_4 + NH_3 + SiH_4$ |
| W-Si-N | $WF_6 + NH_3 + SiH_4$ |
| Ta-Si-N | $TaBr_5 + NH_3 + SiH_4$ |

The metal nitride films are deposited by the thermal CVD method using the starting gases exemplified in Table 1, and fine solid particles of ammonium halide such as $NH_4Cl$ or $NH_4F$ are formed as side reaction products. Further, when $SiH_4$ is used as a portion of the starting gases, fine solid particles containing Si are also formed in a gas phase. Such fine solid particles result in a problem that they remain as a great amount of dust in a CVD chamber or on a substrate to be processed.

For avoiding the problem of dust caused by ammonium salts, it has also been attempted to use $N_2$ or $NF_3$ as shown in Table 2 instead of NH3 as a nitriding gas. In this case, since it is difficult to thermally dissociate $N_2$ or $NH_3$, a plasma CVD method is employed.

TABLE 2

| Metal Nitride | Starting gas |
| --- | --- |
| TaN | $TaBr_5 + N_2 + H_2$ |
| $W_2N$ | $WF_6 + NF_3 + H_2$ |
|  | $WF_6 + N_2 + H_2$ |

However, in RF (13.56 MHz) plasma discharge, for example, by a usual parallel plate type plasma CVD apparatus is insufficient for reducing metal compound gases, namely, metal halides in this case and halogen atoms remain in the resultant deposition films being bonded with metal atoms. Therefore, metal atoms and nitrogen atoms in the deposition film can not form firm bondings. Accordingly, in the heat treatment of the step after the formation of the barrier layer, nitrogen atoms diffuse externally from the barrier layer to bring about a worry of degrading the barrier property to Cu metal interconnections or the like.

SUMMARY OF THE INVENTION

The present invention has been proposed in view of the foregoing problems.

That is, the subject of the present invention is to provide a chemical vapor deposition method of a metal nitride film having a higher barrier property also to easily diffusing metals such as Cu and causing less dust upon film deposition.

Further, it is another subject of the present invention to provide an electronic device such as a semiconductor device of high reliability using a Cu metal which is less resistive but easily diffusing as an interconnecting material, by using the chemical vapor growing method of the metal nitride film.

The present invention has been proposed in order to solve the foregoing subjects.

A chemical vapor growing method of a metal nitride film according to claim 1 of the present invention provides a chemical vapor growing method of a metal nitride film including a step of forming a metal nitride film on a substrate to be processed having a native oxidation film on a surface thereof by using a metal compound gas, wherein the step of forming the metal nitride film comprises:

a first step of reducing a native oxidation film on the surface of the substrate to be processed by activated hydrogen species;

a second step of reducing the metal compound gas by activated hydrogen species to form a metal film on the substrate to be processed; and a third step of irradiating nitrogen containing activated species on the surface of the metal film to convert the metal film into a metal nitride film.

Further, a chemical vapor growing method of a metal nitride film according to claim 7 of the present invention provides a chemical vapor growing method of a metal nitride film including a step of forming a metal nitride film on a substrate to be processed having a native oxidation film on a surface thereof by using a metal compound gas, wherein the step of forming the metal nitride film comprises:

a first step of reducing a native oxidation film on the surface of the substrate to be processed by activated hydrogen species;

a second step of reducing the metal compound gas by activated hydrogen species to form a thin metal film on the substrate to be processed;

a third step of irradiating nitrogen containing activated species on the surface of the thin metal film to convert the thin metal film into a metal nitride film;

a fourth step of reducing the metal compound gas with activated hydrogen species to further form a thin metal film on the thin metal nitride film; and a fifth step of irradiating nitrogen-containing activated species on the surface of the thin metal film formed in the fourth step to convert the thin metal film formed in the fourth step into a thin metal nitride film, in which the fourth step and the fifth step are repeated to form a metal nitride film having a desired thickness.

Then, the present invention in claim 13 provides a method of manufacturing an electronic device having a step of forming a metal nitride film on a substrate to be processed having a native oxidation film on a surface by a chemical vapor growing method using a metal compound gas, wherein the step of forming the metal nitride film comprises:

a first step of reducing a native oxidation film on the surface of the substrate to be processed by activated hydrogen species;

a second step of reducing the metal compound gas by activated hydrogen species to form a metal film on the substrate to be processed; and a third step of irradiating nitrogen-contained activated species on the surface of the metal film to convert the metal film into a metal nitride film.

Then, the present invention in claim 19 provides a method of manufacturing an electronic device having a step of forming a metal nitride film on a substrate to be processed having a native oxidation film on the surface by a chemical vapor growing method using a metal compound gas, wherein the step of forming the metal nitride film comprises:

a first step of reducing a native oxidation film on the surface of the substrate to be processed by activated hydrogen species;

a second step of reducing the metal compound gas by activated hydrogen species to form a thin metal film on the substrate to be processed;

a third step of irradiating nitrogen-contained activated species on the surface of the thin metal film to convert the thin metal film into a metal nitride film;

a fourth step of reducing the metal compound gas with activated hydrogen species to further form a thin metal film on the thin metal nitride film; and a fifth step of irradiating nitrogen-containing activated species on the surface of the thin metal film formed in the fourth step to convert the thin metal film formed in the fourth step into a thin metal nitride film, in which the fourth step and the fifth step are repeated to form a metal nitride film having a desired thickness.

In the inventions described above, any of the reducing steps with the activated hydrogen species has a feature of irradiating activated hydrogen species formed by plasma excitation of a hydrogen gas-containing gas on the surface of the substrate to be processed. The hydrogen gas-containing gas means herein a hydrogen gas itself or a gas mixture containing hydrogen and a rare gas such as Ar.

Further, in the inventions described above, any of the steps of irradiating the nitrogen-containing activated species on the surface of the metal film or the thin metal film has a feature of irradiating activated NH species, $N_2^+$ ions and activated $N_2$ species formed by plasma excitation of nitrogen, ammonia or hydrazine-containing gas.

In any of the inventions described above, the metal nitride film desirably has an amorphous structure showing a broad halo or approximately halo diffraction pattern by X-ray diffraction.

Further in any of the inventions described above, the metal nitride film has a feature of containing Ta, W, Ti or Si as a constituent element. As the materials for such metal nitrides, TaN, $Ta_2N$, WN, $W_2N$, Ta—Si—N, W—Si—N and Ti—Si—N can be mentioned as examples.

In the present invention, the substrate to be processed as an object to form a metal nitride film thereon is a substrate to be formed with an interconnecting layer made of Cu metal or the like, or a substrate to which the interconnecting layer has already been formed. As examples of the structure there can be mentioned those in which a lower interconnecting layer or an impurity diffusion layer, in a case of a semiconductor device, is exposed to the bottom of a connection hole opened to the insulation film as the insulation film.

Since a thin native oxide film is formed on the surface of the lower interconnecting layer, it has to be removed in order to form a multi-layered interconnection of low resistance. When the activated hydrogen species formed by plasma excitation of the hydrogen gas-containing gas are irradiated to the substrate to be processed, the native oxide film at the bottom of the connection hole is reduced and removed. When the lower metal interconnecting layer comprises Cu or W, the native oxide film comprises CuO or $W_3O$ and reducing reaction therefor is as shown by the following equations:

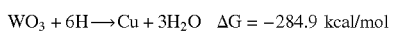

in which H represents activated hydrogen species, ΔG represents standard heat of formation, with positive value (+) indicating an endothermic reaction and negative (−) indicating an exothermic reaction. Accordingly, reaction for reducing to remove the native oxide film by the activated hydrogen species is an exothermic reaction which proceeds readily.

Then, the reaction of reducing the metal compound gas, for example, $WF_6$ with the activated hydrogen species formed by plasma excitation of the hydrogen gas-containing gas is shown by the following equations:

$$WF_6 + 6H \rightarrow W + 6HF \Delta G = -283.4 \text{ kcal/mol}$$

The reaction of reducing $WF_6$ with the hydrogen gas itself by thermal CVD is an endothermic reaction as represented by:

$$WF_6 + 3H_2 \rightarrow W + 6HF \Delta G = 29.2 \text{ kcal/mol},$$

so that the reaction with the activated hydrogen species proceeds more readily and, accordingly, the amount of residual halogen such as residual F in the resultant metal film or thin metal film is decreased.

Successively, activated NH species is irradiated on the surface of the resultant metal film or thin metal film to adsorb and dissociate activated NH species on the surface of the metal film or thin metal film, and N atoms diffuse into the metal film or thin metal film thereby forming a metal nitride film. The nitriding reaction is shown by the following equation:

$$2W + NH \rightarrow W_2N + \tfrac{1}{2}H_2 \Delta G = -113.4 \text{ kcal/mol}$$

On the other hand, the reaction of forming a metal nitride film by direct nitridation of a metal compound gas by the existent method is shown according to the following equation:

$$WF_6 + 2NH_3 \rightarrow \tfrac{1}{2}W_2N + 6HF + \tfrac{3}{4}N_2 \Delta G = 15 \text{ kcal/mol}$$

As apparent from the equations shown above, the method of forming the metal nitride film through diffusion according to the present invention is a system proceeding much more readily than the existent method. Accordingly, a thoroughly nitrided metal nitride film is formed since the amount of the residual halogen such as residual F is also smaller in the previously formed metal film or thin metal film as well.

Furthermore, since the metal halide and the nitriding gas as a metal compound gas are not used in admixture, formation of dust caused by ammonium halide is also decreased. Formation of the dust is further decreased by using $N_2$ or $NH_2$ instead of $NH_3$ as the nitriding gas. In this case, it is desirable to use a high density plasma CVD apparatus capable of obtaining a plasma density higher by two digits or more than the existent parallel plate type plasma CVD apparatus for instance.

The high density plasma CVD apparatus can include, for example, ECR (Electron Cyclotron Resonate) plasma CVD apparatus, helicon wave plasma CVD apparatus and ICP (Inductively Coupled Plasma)-CVD apparatus.

Further, according to the method of manufacturing the electronic device of the present invention, diffusion of metals such as Cu can be prevented satisfactorily by using the metal nitride film formed by the chemical vapor phase growing of the metal nitride film described above for the interconnecting layer and the like. Therefore, electronic devices such as high integration degree semiconductor devices can be manufactured with high reliability.

Examples of the electronic devices to which the present invention is applied can include, for example, high integration degree semiconductor device, as well as thin film magnet head devices, thin film inductor devices, thin film coil devices or micro machine devices, and the metal nitride films can be used, for example, as interconnecting layers of such electronic devices.

BRIEF DESCRIPTIONS OF THE ACCOMPANYING DRAWING

Figure 7:
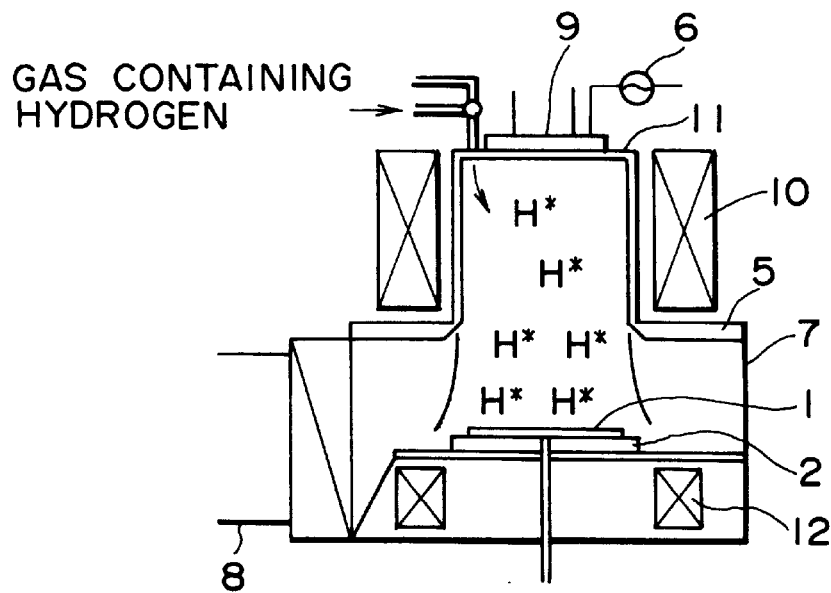
Figure 8:
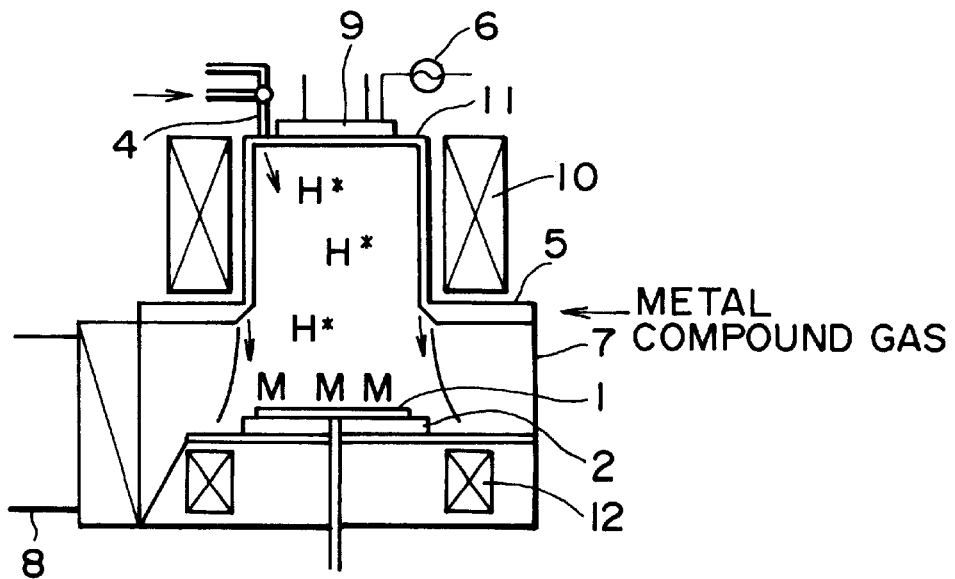
Figure 9:
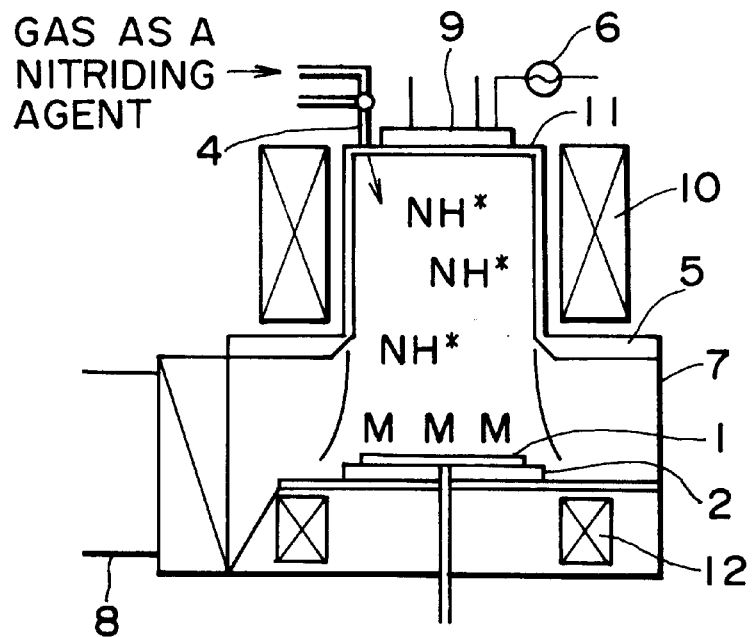
Figure 10:
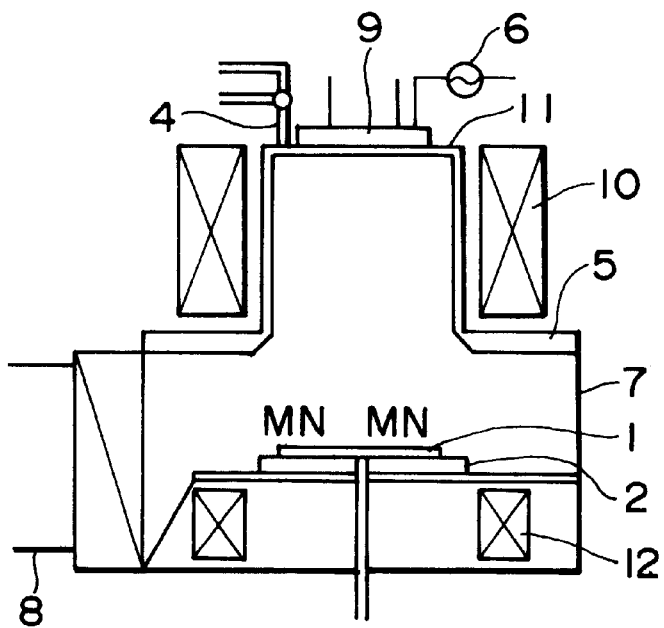

FIG. 7 and FIG. 8 are schematic cross sectional views illustrating an example of a plasma CVD apparatus used in a method of chemical vapor growing of a metal film according to the present invention; and FIG. 9 and FIG. 10 are schematic cross sectional views illustrating an example of a plasma CVD apparatus used in a method of chemical vapor growing of a metal film according to the present invention.

DESCRIPTION OF THE PREFERRED EMBODIMENTS

The present invention will be explained by way of preferred embodiments with reference to the accompanying drawings.

A CVD apparatus used for the chemical vapor growing method of a metal nitride film according to the present invention will be explained with reference to FIG. 7 to FIG. 10.

FIG. 7 to FIG. 10 are schematic cross sectional views illustrating an ECR plasma CVD apparatus.

A substrate stage 2 carrying a substrate 1 to be processed (hereinafter referred to as a substrate) is disposed in a CVD chamber 7. A plasma forming chamber 11 opened to the substrate 1 is disposed in adjacent and opposed to the substrate stage 2. The plasma forming chamber 11 has, disposed on a closed end face thereof, a microwave introduction window 9 made of a dielectric material such as quartz or alumina, which introduces microwaves at 2.45 GHz generated by a magnetron (not illustrated) into the plasma forming chamber 11. A plate electrode (not illustrated) connected with an RF application means 6 is formed to the microwave introduction window 9 except for a central rectangular portion through which microwaves actually transmit, so as to prevent deposition of a metal film on the mirowave introduction window 9. A solenoid coil 10 surrounds the plasma forming chamber 11, and ECR conditions can be attained by interaction between magnetic fields at 0.0875 T generated by the solenoid coil 10 and the microwaves at 2.45 GHz. A first gas introduction port 4 is disposed to the closed end face of the plasma forming chamber 11. A hydrogen-contained gas and a gas as a nitriding agent can selectively be introduced under switching through the first gas introduction port 4. A second gas introduction port 5 in the form of a gas ring head is disposed to an open end face of the plasma forming chamber 11 for introducing a metal compound gas and a carrier gas. An electromagnet 12 is disposed on the back surface of the substrate stage 2 to control the incident direction of the activated species to the substrate 1. An evacuation hole 8 is connected with a high vacuum pump.

FIG. 7 shows a state in which activated hydrogen species (indicated as H*) such as hydrogen ions or hydrogen radicals are being formed in the plasma forming chamber 11 and irradiated on the surface of the substrate 1 to reduce the native oxide film.

FIG. 8 shows a state in which the metal compound gas is being reduced with the activated hydrogen species to form a metal film or a thin metal film (indicated by M) on the substrate 1.

FIG. 9 shows a state in which activated NH species (indicated by NH*) as a typical example of the nitrogen-containing activated species is being irradiated on the metal film or the thin metal film.

FIG. 10 shows a state in which a metal nitride film or a thin metal nitride film (indicated by MN) is formed on the substrate 1.

The CVD apparatus shown for the structure and the operation in FIG. 7 to FIG. 10 is an example of an apparatus capable of suitably practicing the chemical vapor growing method of the metal nitride film according to the present invention but any of the CVD apparatus may be used so long as the apparatus can selectively introduce the hydrogen-containing gas, the nitriding gas and the gas containing the metal compound gas under switching.

EXAMPLE

Explanations will be made specifically with reference to FIG. 1 to FIG. 6 to examples of applying the chemical vapor phase growing method of a metal nitride film according to the present invention and burying a connection hole formed to an interlayer insulation film between each of multi-layered interconnecting layers of a semiconductor device of a high integration degree as an example of an electronic device with a metal nitride film and a Cu metal film. It should, however, be noted that the present invention is not restricted to such examples.

Example 1

Figure 3:
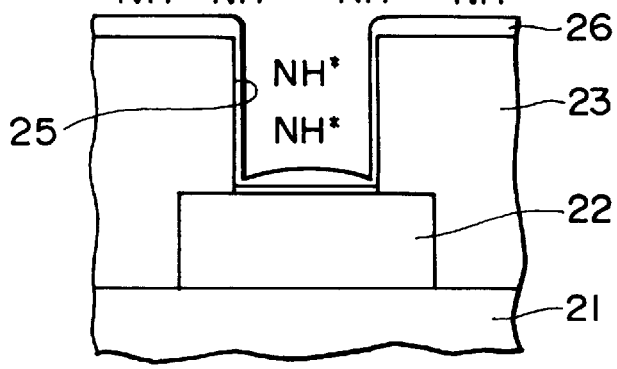
Figure 4:
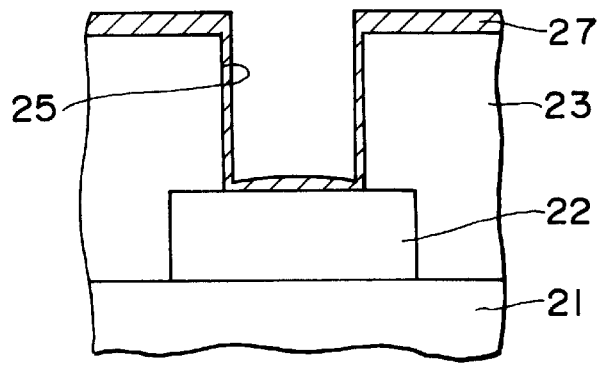
FIG. 4 to FIG. 6 are schematic cross sectional views illustrating the second half, succeeding to FIG. 1 to FIG. 3, of a method of manufacturing an electronic device according to the present invention.

This is an example of forming a metal nitride film comprising $W_2N$ using the ECR plasma CVD apparatus shown in FIG. 3 to FIG. 4.

Figure 1:
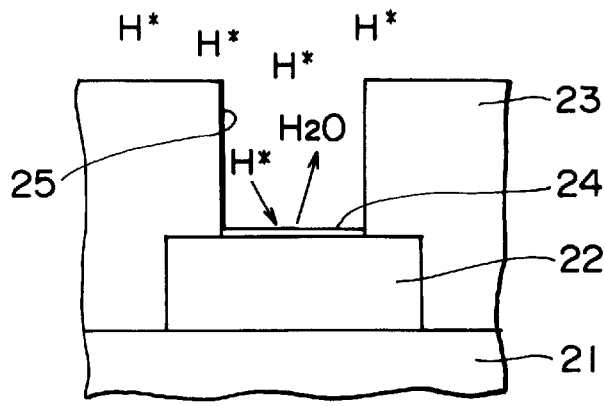
FIG. 1 to FIG. 3 are schematic cross sectional views illustrating the first half of a method of manufacturing an electronic device according to the present invention.

In the substrate to be processed used in this example, as shown in FIG. 1, a lower interconnecting layer 22 and an upper interlayer insulation film 23 are formed on a lower interlayer insulation film 21 formed on a semiconductor substrate made of Si (not illustrated), and a connection hole 25 is formed being faced to the lower layer interconnection 22 in the upper interlayer insulation film 23. A native oxide film 24 is formed on the surface of the lower interconnecting layer 22 exposed to the bottom of the connection hole 25.

Among them, the lower interconnecting layer 22 is formed with Cu series metal or a high melting metal such as W but it may be made of polycrystal silicon, high melting metal polycide or Al series metal.

The connection hole 25, which is a via hole in this case has, an opening diameter, for example, of 0.18 μm with an aspect ratio of about 5.

[First Step]

The substrate to be processed shown in FIG. 1 is set on the substrate stage 2 of the ECR plasma CVD apparatus shown in FIG. 7, $H_2/Ar$ gas mixture is introduced through the gas introduction port 4 and hydrogen plasma treatment is applied under the following conditions:

| | |
|---|---|
| $H_2$ flow rate | 100–300 sccm |
| Ar flow rate | 100–100 sccm |
| Entire pressure | 1–10 mTorr |
| Microwave power | 1000–3000 W (2.45 GHz) |
| Substrate temperature | 200–400° C. |
| Processing time | 30–300 sec |

Ranges of the numerical values for the plasma processing conditions belong to design matters, which are varied, for example, depending on the configuration and the volume of the CVD chamber 7, the thickness of the native oxide film on the substrate to be processed and the like, and a generally satisfactory plasma process can be attained within the ranges described above.

In the plasma processing step, the introduced gases are excited by ECR discharge into high density plasmas, in which $H_2$ dissociates to form activated hydrogen species by collision with electrons in the plasmas. When the activated hydrogen species are irradiated on the surface to be processed, they are easily incident as far as the bottom of the connection hole 25 in which the native oxide film 24 comprising, for example, of CuO or $WO_3$ on the surface of the lower interconnecting layer 22 is reduced by the incident hydrogen atoms, so that clean surface of Cu or W is exposed.

[Second Step]

Subsequently, while continuing introduction of the $H_2/Ar$ gas mixture and ECR discharge, a metal compound gas, $WF_6$ in this example, is introduced through the second gas introduction port 5.

| | |
|---|---|
| $WF_6$ flow rate | 2–10 sccm |
| $H_2$ flow rate | 100–300 sccm |
| Ar flow rate | 100–200 sccm |
| Entire pressure | 1–10 mTorr |
| Microwave power | 1000–3000 W (2.45 GHz) |
| Substrate temperature | 200–400° C. |
| Treating time | 30–180 sec |

Figure 2:
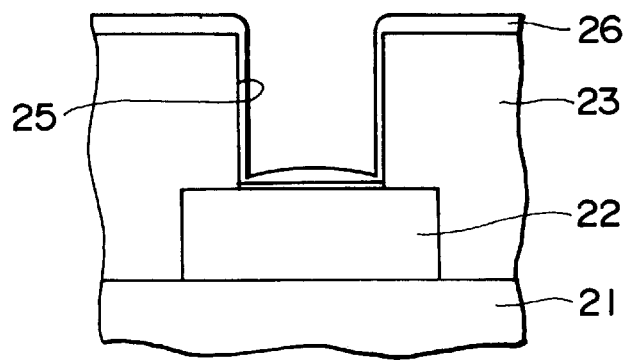

In this step, $WF_6$ is reduced with the activated hydrogen species to form a metal film 26 on the substrate to be processed with a good step coverage. The reduction reaction is an exothermic reaction with the standard of heat generation of $\Delta G=-283.4$ kcal as described previously, which proceeds readily to form the metal film 26 comprising W with low fluorine content. This state is shown in FIG. 2 and FIG. 8.

The thickness of the metal film 26 is about 20 to 50 nm at a flat portion on the surface of the upper interlayer insulation film 23.

[Third Step]

Subsequently, introduction of the hydrogen-containing gas and the metal compound gas is stopped, and the nitriding gas is introduced by switching through the first gas introduction port 4. ECR discharge is continued. A gas mixture of $N_2/H_2/Ar$ is used as the nitriding gas.

| | |
|---|---|
| $N_2$ flow rate | 100–300 sccm |
| $H_2$ flow rate | 50–200 sccm |
| Ar flow rate | 100–300 sccm |
| Entire pressure | 1–10 mTorr |
| Microwave power | 1000–3000 W (2.45 GHz) |

-continued

| Substrate temperature | 200–400° C. |
|---|---|
| Processing time | 30–300 sec |

By the ECR discharge, $N_2/H_2/Ar$ plasmas are formed in the plasma forming chamber 11. In the plasmas, hydrogen atoms in an excited state are formed due to collision between electrons and $H_2$ gas and, at the same time, the $N_2$ gas is also dissociated into nitrogen atoms. Further, the hydrogen atoms and the nitrogen atoms are bonded to mainly form activated NH species. In addition, activated nitrogen-containing activated species such as $N_2^+$ ions or activated $N_2$ species are formed. Formation of the activated NH species can be confirmed by emission spectrum at 336 nm by plasma spectrophotometry. Further, $N_2^+$ ion and activated $N_2$ species can be confirmed as spectrum at 391.9 nm and at 357.7 nm or 353.7 nm, respectively.

Activated nitrogen-containing species including activated NH species are drawn into the CVD chamber 7 and irradiated to the substrate 1 to be processed. This state is shown in FIG. 3 and FIG. 9.

By the irradiation of the activated NH species, the activated NH species are dissociated on the surface of the metal film 26 comprising W, and nitrogen atoms formed are diffused in the metal film 26 to form a metal nitride film 27 comprising amorphous $W_2N$. This state is shown in FIG. 4 and FIG. 10.

Nitriding reaction of W by the irradiation of the activated NH species is also an exothermic reaction with $\Delta G=-113.4$ kcal as described previously, which proceeds readily.

If the thus formed metal nitride film 27 has a desired film thickness, the process proceeds to the succeeding step. If the desired film thickness can not be attained, the second step and the third step are repeated to form a metal nitride film of a desired thickness. While duplicating explanations are omitted, this repeating process will be understood by reading the foregoing descriptions while replacing "metal film" with "thin metal film" and "metal nitride film" with "thin metal nitride film" and replacing "second step" and "third step" with "fourth step" and "fifth step", respectively.

Figure 5:
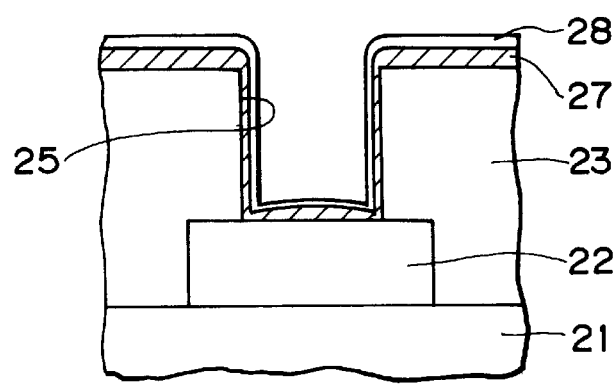

Then, for forming the upper interconnecting layer, as shown in FIG. 5, a seed layer 28 made of Cu metal is formed by a well-known long distance sputtering method or a CVD method. Since it may suffice that the seed layer 27 has a function as a conductive layer, it may be as thin as about 30 nm, for instance.

Figure 6:
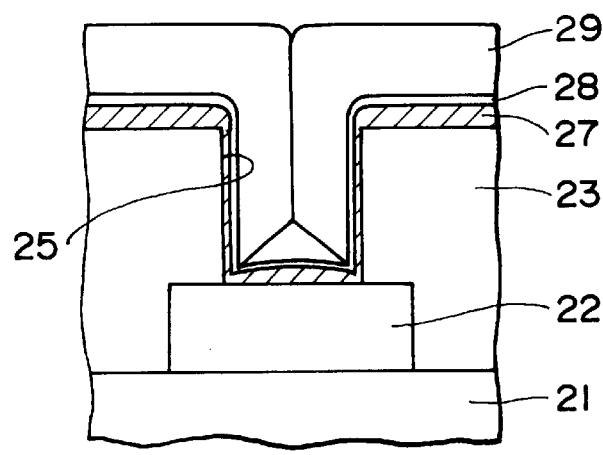

Subsequently, as shown in FIG. 6, an upper metal interconnecting layer 29 comprising Cu metal is formed also by a well-known electric plating method to bury the inside of the connection hole 25.

While subsequent steps are not illustrated, the upper metal interconnecting metal 29, the seed layer 28 and the metal nitride film 27 are patterned to form an upper interconnecting layer. Alternatively, the upper metal interconnecting layer 29, the seed layer 28 and the metal nitride film 27 are flattened and polished by CMP (Chemical Mechanical Polishing) to leave them only in the connection hole 25 to form a contact plug.

In this example, a metal nitride film comprising $W_2N$ can be formed with no dust generated by ammonium salts by forming the metal film and forming the metal nitride film in the succeeding nitriding step. Further, when the metal nitride film is applied to the barrier layer in the multi-layered interconnection structure of a high integration degree semiconductor device, it is possible to provide a semiconductor device of high reliability in which diffusion of the Cu metal interconnection is effectively prevented.

Example 2

This is also an example of forming a metal nitride film comprising TaN by the ECR plasma CVD apparatus shown in FIG. 7 to FIG. 10.

Since the substrate to be processed used in this example is in accordance with that explained with reference to FIG. 1 in the previous example, duplicate explanations are omitted.

[First Step]

The reduction step of the native oxide film 24 on the substrate to be processed shown in FIG. 1 with the activated hydrogen species may also be identical with that in the previous Example 1.

[Second Step]

Subsequently, while continuing introduction of the $H_2/Ar$ gas mixture and ECR discharge, a metal compound gas, $TaBr_5$ in this example, is introduced through the second gas introduction port 5. Since $TaBr_5$ is a solid source, it is heated to about 150–200° C. and introduced as an evaporated gas. Accordingly, the second gas introduction port 5 and a gas pipe line connected therewith may desirably be heated by using a ribbon heater or the like.

| $TaBr_5$ flow rate | 2–10 sccm |
|---|---|
| $H_2$ flow rate | 100–300 sccm |
| Ar flow rate | 100–200 sccm |
| Entire pressure | 1–10 mTorr |
| Microwave power | 1000–3000 W (2.45 GHz) |
| Substrate temperature | 200–400° C. |
| Processing time | 30–180 sec |

In this step, TaBrs is reduced with the activated hydrogen species to form a metal film 26 comprising Ta on the substrate with a good step coverage. The reduction reaction is an exothermic reaction represented by:

Accordingly, the reduction proceeds readily to form the metal film 26 comprising Ta with low Br content. This state is shown in FIG. 2 and FIG. 8.

The thickness of the metal film 26 is about 20 to 50 nm at a flat portion on the surface of the upper interlayer insulation film 23.

[Third Step]

The subsequent state of irradiating nitrogen-containing activated species may be in accordance with the previous Example 1.

By the irradiation of nitrogen-containing activated species such as activated NH species, the activated NH species are dissociated on the surface of the metal film 26 comprising Ta, nitrogen atoms formed are diffused in the metal film 26 to form a metal nitride film 27 comprising amorphous TaN. This state is shown in FIG. 4 and FIG. 10.

Ta nitriding reaction by the irradiation of the activated NH species is a readily proceeding system represented by:

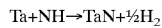

If the metal nitride film 27 thus formed has a desired film thickness, the process proceeds to the succeeding step. If the desired film thickness can not be attained, the second step and the third step are repeated to form a metal nitride film of a desired thickness. While duplicating explanations are omitted, this repeating process will be understood by reading the foregoing descriptions while replacing "metal film" with "thin metal film" and "metal nitride film" with "thin metal nitride film" and replacing "second step" and "third step" with "fourth step" and "fifth step", respectively.

Subsequent step for forming the upper interconnecting layer may be identical with that in the previous Example 1.

In this example, a metal nitride film comprising TaN can be formed with no dust generated by ammonium salts by forming the metal film and forming the metal nitride film in the succeeding nitriding step. Further, when the metal nitride film is applied to the barrier layer in the multi-layered interconnection structure of a high integration degree semiconductor device, it is possible to provide a semiconductor device of high reliability in which diffusion of the Cu metal interconnection can be effectively prevented.

Detailed explanations have been made for the chemical vapor growing method of the metal nitride film and the method of manufacturing the electronic devices using the metal nitride film according to the present invention, but the present invention is not restricted only to such examples and can be practiced in various embodiments.

For example, various kinds of metal nitrides such as WN or $Ta_2N$ or metal siliconitride such as Ti—Si—N, W—Si—N and Ta—Si—N can be used in addition to $W_2N$ and TaN shown as the examples for the material of the metal nitride film. Further, TiN deposited, for example, by a sputtering method and having a columnar crystal structure that involves a problem of grain boundary diffusion, the barrier property can be improved by applying the metal nitride film forming method of the present invention.

For any of the materials, a metal nitride film with less residual ingredient of the starting metal compound gases and nitrided sufficiently can be obtained as an amorphous structure.

While the activated species containing nitrogen are formed by plasma excitation of a gas mixture comprising $N_2/H_2/Ar$, they may be obtained also by plasma excitation of gases containing $NH_3$ or $N_2H_4$ when such nitriding gas is used, dust such as ammonium halide is not formed.

The chemical vapor growing method of the metal nitride film according to the present invention can be used suitably for the barrier layer of the interconnection in various types of electronic devices such as semiconductor devices. As the interconnecting material, various kinds of metals such as Ag or Al can be used in addition to Cu metal involving a problem of diffusion.

While the Cu interconnecting layer is formed by the electrolytic plating method in this example, it may also be formed by the CVD method. For the starting gas in this case, various kinds of organic and inorganic metal compounds can be used in addition to Cu(hfac) (tmvs) or Cu(hfac). Cu(hfac) is a compound in which hfac (Hexafluoroacetylacetonate) is bonded to a Cu atom, and Cu(hfac) (tmvs) is a compound in which tmvs (Trimethylvinylsilane) is further bonded to Cu(hfac).

In addition to the application to interconnections for burying the connection hole in the high density semiconductor device as the electronic device, this invention is also applicable to various kinds of electronic devices requiring interconnections with low resistivity such as various types of semiconductor devices and magnetic head devices.

As apparent from the foregoing explanations, according to the chemical vapor growing method of the metal nitride film of the present invention, it is possible to form a metal nitride film of an amorphous structure which is reduced with formation of dust upon film deposition and nitrided thoroughly.

Further, according to the method of manufacturing the electronic device of the present invention, it is enabled to use a metal film such of Cu which has low resistance but shows strong diffusion as the interconnecting material, by using the chemical vapor growing method of the metal nitride film described above and applying it to the barrier layer. This can improve the working frequency of various types of electronic devices including high density semiconductor devices and can stably supply highly reliable electronic devices with reduced electric power consumption and also excellent in migration resistance.

What is claimed is:

1. A chemical vapor deposition method of forming a metal nitride film on a substrate having a native oxide film on a surface thereof, which comprises the steps of:
   introducing a mixture consisting of hydrogen gas and an inert gas, activating said hydrogen gas to form an activated hydrogen species, and reducing said native oxide film on the surface of said substrate by said activated hydrogen species;
   introducing a metal compound gas, and reducing said metal compound gas by said activated hydrogen species to form a metal film on said substrate; and
   irradiating a nitrogen-containing activated species on a surface of said metal film to convert said metal film into a metal nitride film having an amorphous structure.

2. A method as defined in claim 1, wherein the step of reducing said native oxide film by the activated hydrogen species comprises activating a hydrogen species by plasma excitation of a hydrogen-contained gas, and irradiating said activated hydrogen species to said surface of said substrate.

3. A method as defined in claim 1, wherein said step of irradiating the nitrogen-containing activated species comprises forming an activated NH species, an activated $N_2^+$ ion and an activated $N_2$ species by plasma excitation of a gas containing at least one of nitrogen, ammonia and hydrazine, and irradiating said activated NH species said, activated $N_2^+$ ion, and said activated $N_2$ species onto said surface of said metal film.

4. A method as defined in claim 1, wherein said metal nitride film contains at least one of Ta, W, Ti or Si.

5. A method as defined in claim 1, wherein said metal nitride film contains at least one material of TaN, $Ta_2N$, WN, $W_2N$, Ta—Ai—N, W—Si—N and Ti—Si—N.

6. A chemical vapor deposition method of forming a metal nitride film on a substrate having a native oxide film on a surface thereof, which comprises the steps of:
   (a) reducing said native oxide film on said surface of said substrate by an activated hydrogen species;
   (b) introducing a first metal compound gas, and reducing said first metal compound gas by said activated hydrogen species to form a first thin metal film on said substrate; and
   (c) irradiating a first nitrogen-contained activated species on a surface of said first thin metal film to convert said first thin metal film into a first thin metal nitride film;
   (d) introducing a second metal compound gas, and reducing said first metal compound gas with said activated hydrogen species to form a second thin metal film on said first thin metal nitride film;
   (e) irradiating a second nitrogen-contained activated species on a surface of the second thin metal film to convert the second thin metal film into a second thin metal nitride film and
   repeating steps (d) and (e) if necessary until a total thickness of metal nitride films a predetermined thickness.

7. A method as defined in claim 6, wherein the step of reducing said native oxide film by the activated hydrogen species comprises activating a hydrogen species by plasma excitation of a hydrogen-contained gas, and irradiating said activated hydrogen species to said surface of said substrate.

8. A method as defined in claim 6, wherein said step of irradiating the nitrogen-containing activated species comprises forming an activated NH species, an activated $N_2^+$ ion and an activated $N_2$ species by plasma excitation of a gas containing at least one of nitrogen, ammonia and hydrazine, and irradiating said activated NH species, said activated $N_2^+$ ion, and said activated $N_2$ species onto said surface of said metal film.

9. A method as defined in claim 6, wherein each of said metal nitride films have an amorphous structure.

10. A method as defined in claim 6, wherein each of said metal nitride films contains at least one material of Ta, W, Ti or Si.

11. A method as defined in claim 6, wherein each of said metal nitride films contains at least one material of TaN, $Ta_2N$, WN, $W_2N$, Ta—Ai—N, W—Si—N and Ti—Si—N.

12. A method of manufacturing an electronic device by a chemical vapor deposition method, which comprises the steps of:
   reducing a native oxide film on the surface of a substrate by an activated hydrogen species;
   after completion of said reducing step, introducing a metal compound gas, and reducing said metal compound gas by said activated hydrogen species to form a metal film on said substrate; and
   irradiating a nitrogen-containing activated species on a surface of said metal film to convert said metal film into a metal nitride film having an amorphous structure.

13. A method of manufacturing an electronic device as defined in claim 12, the step of reducing said native oxide film by said activated hydrogen species comprises activating a hydrogen species by plasma excitation of a hydrogen-contained gas, and irradiating said activated hydrogen species to said surface of said substrate.

14. A method of manufacturing an electronic device as defined in claim 12, wherein said step of irradiating the nitrogen-containing activated species comprises forming an activated NH species, an activated $N_2^+$ ion and an activated $N_2$ species by plasma excitation of a gas containing at least one of nitrogen, ammonia and hydrazine, and irradiating said activated NH species, said activated $N_2^+$ ion, and said activated $N_2$ species onto said surface of said metal film.

15. A method of manufacturing an electronic device as defined in claim 12, wherein said metal nitride film contains at least one of Ta, W, Ti or Si.

16. A method of manufacturing an electronic device as defined in claim 12, wherein said metal nitride film contains at least one material of TaN, $Ta_2N$, WN, $W_2N$, Ta—Si—N, W—Si—N and Ti—Si—N.

17. A method of manufacturing an electronic device by a chemical vapor deposition method, which comprises the steps of:
   (a) reducing said native oxide film on said surface of said substrate by an activated hydrogen species;
   (b) introducing a first metal compound gas, and reducing said first metal compound gas by said activated hydrogen species to form a first thin metal film on the substrate; and
   (c) irradiating a first nitrogen-contained activated species on a surface of said first thin metal film to convert said first thin metal film into a first thin metal nitride film;
   (d) introducing a second metal compound gas, and reducing said first metal compound gas with said activated hydrogen species to form a second thin metal film on said first thin metal nitride film;
   irradiating a second nitrogen-contained activated species on a surface of the second thin metal film to convert the second thin metal film into a second thin metal nitride film and
   repeating steps (d) and (e) if necessary, until a total thickness of metal nitride films reach a predetermined thickness.

18. A method of manufacturing an electronic device as defined in claim 17, wherein the step of reducing said native oxide film by the activated hydrogen species comprises activating a hydrogen species by plasma excitation of a hydrogen-contained gas, and irradiating said activated hydrogen species to said surface of said substrate.

19. A method of manufacturing an electronic device as defined in claim 17, wherein said step of irradiating the nitrogen-containing activated species comprises forming an activated NH species, an activated $N_2^+$ ion and an activated $N_2$ species by plasma excitation of a gas containing at least one of nitrogen, ammonia and hydrazine, and irradiating said activated NH species, said activated $N_2^+$ ion, and said activated $N_2$ species onto said surface of said metal film.

20. A method of manufacturing an electronic device as defined in claim 17, wherein each of said metal nitride films have an amorphous structure.

21. A method of manufacturing an electronic device as defined in claim 17, wherein each of said metal nitride films contains at least one material of Ta, W, Ti or Si.

22. A method of manufacturing an electronic device as defined in claim 17, wherein each of said metal nitride films contains at least one material of TaN, $Ta_2N$, WN, $W_2N$, Ta—Ai—N, W—Si—N and Ti—Si—N.

* * * * *

UNITED STATES PATENT AND TRADEMARK OFFICE
CERTIFICATE OF CORRECTION

PATENT NO. : 6,284,649 B1
DATED : September 4, 2001
INVENTOR(S) : Takaaki Miyamoto It is certified that error appears in the above-identified patent and that said Letters Patent is hereby corrected as shown below:

Column 12, claim 6,
Line 64, insert -- reach -- immediately after " films".

Column 14, claim 16,
Line 1, replace " Ta-Si-N" with -- Ta-Ai-N --.

Signed and Sealed this

Second Day of April, 2002

Attest:

Attesting Officer

JAMES E. ROGAN
Director of the United States Patent and Trademark Office